(12) United States Patent
Frosien (10) Patent No.: US 9,666,404 B2
(45) Date of Patent: May 30, 2017

(54) CHARGED PARTICLE SOURCE ARRANGEMENT FOR A CHARGED PARTICLE BEAM DEVICE, CHARGED PARTICLE BEAM DEVICE FOR SAMPLE INSPECTION, AND METHOD FOR PROVIDING A PRIMARY CHARGED PARTICLE BEAM FOR SAMPLE INSPECTION IN A CHARGED PARTICLE BEAM

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiteprüftechnik mbH, Heimstetten (DE)

( * ) Notice: Subject to any disclaimer, the term of this patent is extended or adjusted under 35 U.S.C. 154(b) by 0 days.

(21) Appl. No.: 15/041,008

(22) Filed: Feb. 10, 2016

(65) Prior Publication Data

US 2016/0240345 A1 Aug. 18, 2016

Related U.S. Application Data

(60) Provisional application No. 62/117,667, filed on Feb. 18, 2015.

(51) Int. Cl.
*H01J 37/077* (2006.01)
*H01J 37/08* (2006.01)
*H01J 37/09* (2006.01)
*H01J 37/065* (2006.01)

(52) U.S. Cl.
CPC ....... *H01J 37/065* (2013.01); *H01J 2237/057* (2013.01); *H01J 2237/164* (2013.01); *H01J 2237/182* (2013.01)

(58) Field of Classification Search
USPC ....... 250/306, 307, 309–311, 396 R, 441.11, 250/426
See application file for complete search history.

(56) References Cited

U.S. PATENT DOCUMENTS 6,576,908 B1 * 6/2003 Winkler ............. H01J 37/1472
250/396 R
6,812,472 B2 * 11/2004 Takekoshi ............ H01L 21/682
250/441.11

(Continued)

*Primary Examiner* — Bernard Souw
(74) *Attorney, Agent, or Firm* — Kilpatrick Townsend & Stockton LLP (57) ABSTRACT

The present disclosure provides a charged particle source arrangement for a charged particle beam device. The charged particle source arrangement includes: a first vacuum region and a second vacuum region; a charged particle source in the first vacuum region, wherein the charged particle source is configured to generate a primary charged particle beam; and a membrane configured to provide a gas barrier between the first vacuum region and the second vacuum region, and wherein the membrane is configured to let at least a portion of the primary charged particle beam pass through the membrane, wherein a first vacuum generation device is connectable to the first vacuum region and a second vacuum generation device is connectable to the second vacuum region.

18 Claims, 5 Drawing Sheets

(56) References Cited

U.S. PATENT DOCUMENTS

| | | | | |
|---|---|---|---|---|
| 8,106,358 B2* | 1/2012 | Spallas | ................... | H01J 37/12 250/306 |
| 8,426,835 B2* | 4/2013 | Kasuya | ................. | B82Y 10/00 250/396 R |
| 8,586,949 B2* | 11/2013 | Dinu-Gurtler | ......... | B82Y 10/00 250/396 R |
| 8,916,837 B2* | 12/2014 | Dinu-Gurtler | ......... | B82Y 10/00 250/396 R |
| 2004/0007677 A1* | 1/2004 | Takekoshi | ............. | H01L 21/682 250/492.2 |
| 2010/0224777 A1* | 9/2010 | Spallas | ................... | H01J 37/12 250/307 |

* cited by examiner

CHARGED PARTICLE SOURCE ARRANGEMENT FOR A CHARGED PARTICLE BEAM DEVICE, CHARGED PARTICLE BEAM DEVICE FOR SAMPLE INSPECTION, AND METHOD FOR PROVIDING A PRIMARY CHARGED PARTICLE BEAM FOR SAMPLE INSPECTION IN A CHARGED PARTICLE BEAM

CROSS-REFERENCE TO RELATED APPLICATIONS

This application claims priority to Provisional Application No. 62/117,667, filed Feb. 18, 2015 the entire contents of which are incorporated by reference herein for all purposes.

FIELD

Embodiments of the present disclosure relate to a charged particle source arrangement for a charged particle beam device, a charged particle beam device for sample inspection, and a method for providing a primary charged particle beam for sample inspection in a charged particle beam device. Embodiments of the present disclosure specifically relate to charged particle beam devices, for example, for inspection system applications, testing system applications, lithography system applications, defect review or critical dimensioning applications or the like.

BACKGROUND

Charged particle beam devices can be used, for example, in electron beam inspection (EBI), defect review and critical dimension measurement. Upon irradiation of a specimen or sample by a primary charged particle beam, signal charged particles, such as secondary electrons (SE), are created, which may carry information about the topography of the specimen, the chemical constituents of the specimen, the electrostatic potential of the specimen and other information of the specimen. The signal charged particles are collected and guided to a sensor, e.g., a scintillator, a pin diode or the like.

The performance of a charged particle source in providing the primary charged particle beam in a charged particle beam device is of particular interest. As an example, high brightness charged particle sources and/or high emission current sources with high emission stability are beneficial. The charged particle sources can be operated under vacuum conditions, wherein the performance of the charged particle sources can be related to a quality of the vacuum. A low vacuum pressure, and particularly a low partial pressure of residual gases, which may poison e.g. a primary charged particle emitter of the charged particle source, is beneficial. For example, oxygen can have a negative impact on a work function of the emitter material and/or on the primary charged particle emission.

In view of the above, new charged particle source arrangements for a charged particle beam device, charged particle beam devices for sample inspection, and methods for providing a primary charged particle beam for sample inspection in a charged particle beam device that overcome at least some of the problems in the art are beneficial. In particular, charged particle source arrangements, charged particle beam devices, and methods for providing a primary charged particle beam for sample inspection in a charged particle beam device that provide at least one of an improved charged particle source stability and a simplification of a vacuum system of a charged particle source arrangement are beneficial.

SUMMARY

In light of the above, a charged particle source arrangement for a charged particle beam device, a charged particle beam device for sample inspection, and a method for providing a primary charged particle beam for sample inspection in a charged particle beam device are provided. Further aspects, benefits, and features of the present disclosure are apparent from the claims, the description, and the accompanying drawings.

According to an aspect of the present disclosure, a charged particle source arrangement for a charged particle beam device is provided. The charged particle source arrangement includes: a first vacuum region and a second vacuum region; a charged particle source in the first vacuum region, wherein the charged particle source is configured to generate a primary charged particle beam; and a membrane configured to provide a gas barrier between the first vacuum region and the second vacuum region, and wherein the membrane is configured to let pass at least a portion of the primary charged particle beam through the membrane, wherein a first vacuum generation device is connectable to the first vacuum region and a second vacuum generation device is connectable to the second vacuum region.

According to another aspect of the present disclosure, a charged particle source arrangement for a charged particle beam device is provided. The charged particle source arrangement includes: a first vacuum chamber having an exit opening for a primary charged particle beam; a charged particle source in the first vacuum chamber, wherein the charged particle source is configured to generate the primary charged particle beam; and a membrane covering the exit opening, wherein the membrane is configured to let pass at least a portion of the primary charged particle beam.

According to still another aspect of the present disclosure, a charged particle beam device for sample inspection is provided. The charged particle beam device includes the charged particle source arrangement according to the embodiments described herein and a sample chamber connected to the charged particle source arrangement.

According to yet another aspect of the present disclosure, a method for providing a primary charged particle beam for sample inspection in a charged particle beam device is provided. The method includes: Emitting of the primary charged particle beam using a charged particle source in a first vacuum region; and guiding of at least a portion of the primary charged particle beam from the first vacuum region into a second vacuum region through a membrane, wherein the membrane is configured to provide a gas barrier between the first vacuum region and the second vacuum region.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
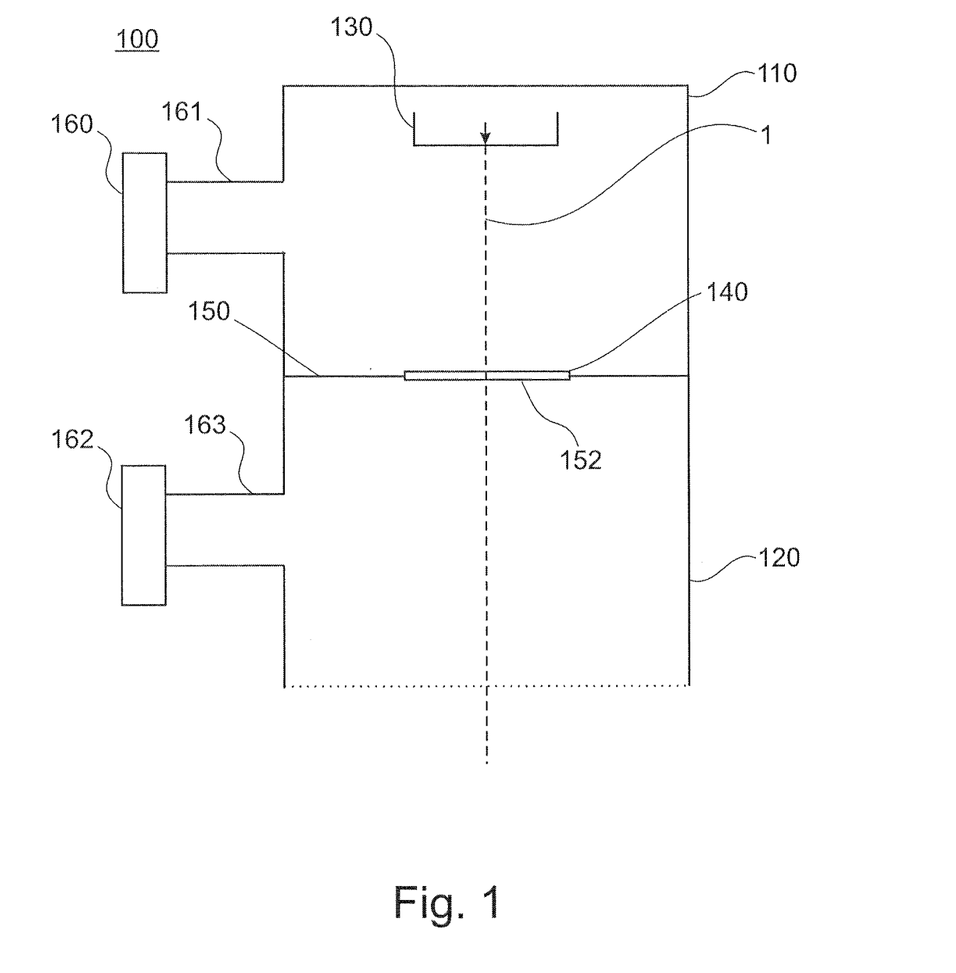
FIG. 1 shows a schematic view of a charged particle source arrangement according to embodiments described herein.

FIG. 1 shows a schematic view of a charged particle source arrangement 100 according to embodiments described herein.

The charged particle source arrangement 100 includes a first vacuum region 110 and a second vacuum region 120, a charged particle source 130 in the first vacuum region 110, wherein the charged particle source 130 is configured to generate a primary charged particle beam, and a membrane 140 configured to provide a gas barrier between the first vacuum region 110 and the second vacuum region 120. The primary charged particle beam can travel along an optical axis 1. The membrane 140 is configured to let pass at least a portion of the primary charged particle beam through the membrane 140. A first vacuum generation device 160 is connectable to the first vacuum region 110 and a second vacuum generation device 162 is connectable to the second vacuum region 120. The first vacuum region 110 and the second vacuum region 120 can be adjacent vacuum regions. In some embodiments, which can be combined with other embodiments described herein, the membrane 140 can be configured to seal, e.g., mechanically seal, the first vacuum region 110 and the second vacuum region 120 off from one another.

The present disclosure provides the membrane 140 that can be positioned close to the charged particle source 130, e.g. at or in an anode or an extractor, to mechanically separate the first vacuum region 110 from the second vacuum region 120. As an example, the second vacuum region 120 can be an intermediate vacuum region provided between the first vacuum region 110 having the charged particle source 130 and a vacuum region accommodating a specimen or sample to be inspected. The membrane 140 can be made thin and/or of a light material and can enable a substantially undisturbed transition of the primary charged particle beam, e.g., of electrons. In some implementations, the membrane 140 can be mechanically stable enough to withstand air pressure, e.g., in the case that one of the vacuum regions above or below the membrane 140 is vented. Under the normal operation conditions of a vacuum being on both sides of the membrane 140, substantially no mechanical stress will act on the membrane 140.

The present disclosure enables the generation of good vacuum levels by a simple configuration. In particular, the first vacuum generation device connectable to the first vacuum region 110 and the second vacuum generation device connectable to the second vacuum region 120 allow for a differential pumping of the first vacuum region 110 and the second vacuum region 120. Improved vacuum conditions can be achieved in the first vacuum region 110, in which the charged particle source 130 is provided. By mechanically separating the first vacuum region 110 from the second vacuum region 120 using the membrane 140, a contamination of the charged particle source 130, e.g., with molecules drifting from the second vacuum region 120 into the first vacuum region 110 can be reduced or even avoided. A stability of the charged particle source 130 can be increased.

The term "gas barrier" as used throughout the disclosure can be understood as a barrier that prevents or blocks a movement, e.g., of gas molecules, from one place to another, and in particular a movement of gas molecules from the second vacuum region 120 into the first vacuum region 110. The membrane 140 may be taken to mean a material, e.g., a solid material, that blocks passage from the second vacuum region 120 into the first vacuum region 110, and vice versa.

According to some embodiments, which can be combined with other embodiments described herein, the membrane 140 is made of a solid material. The term "solid material" can be taken to mean a material that is suitable to provide the gas barrier between the first vacuum region 110 and the second vacuum region 120 to mechanically separate the first vacuum region 110 from the second vacuum region 120. As an example, the solid material includes a material selected from the group consisting of: Silicon, carbon, silicon oxide, silicon nitride, and any combination thereof.

According to some embodiments, which can be combined with other embodiments described herein, the membrane 140 is at least partially covered with the conductive material. The conductive material can include, but is not limited to, at least one of carbon, platinum, gold, silver, and any combination thereof. In some implementations, at least a part of the membrane 140 is doped to provide electrical conductivity. As an example, the membrane 140 can be doped with the conductive material. In coating the membrane 140 with a thin conductive material, e.g., carbon, platinum or the like, a charging of the membrane 140 can be reduced or even avoided. A doping of the membrane material (e.g. with Boron) can be used to achieve electrical conductivity.

The term "vacuum region" as used throughout the disclosure can be understood as a space that is substantially devoid of matter, e.g., a space from which all or most of the air or gas has been removed. Considering a performance, for example, of charged particle sources, field emission electron sources (e.g. thermal field emission, Schottky emission, and cold field emission) or carbon nanotubes, a provision of an ultra-high vacuum in the first vacuum region 110 can be beneficial. The term "ultra-high vacuum" may refer to a pressure range of $1\times10^{-7}$ to $1\times10^{-11}$ Pa, and may specifically refer to a pressure range of $1\times10^{-7}$ to $1\times10^{-10}$ Pa.

According to some embodiments, which can be combined with other embodiments described herein, a vacuum chamber can be configured to provide one or more vacuum regions, such as the first vacuum region 110 and/or the second vacuum region 120. In some implementations, a first vacuum chamber can be configured to provide the first vacuum region 110 and a second vacuum chamber can be configured to provide the second vacuum region 120. The first vacuum chamber and the second vacuum chamber can be connected to each other to allow a passage of the primary charged particle beam from the first vacuum chamber into the second vacuum chamber. In other implementations, one vacuum chamber can be configured to provide the first vacuum region 110 and the second vacuum region 120. In other words, the first vacuum region 110 and the second vacuum region 120 can be provided in the same vacuum chamber.

According to some embodiments, which can be combined with other embodiments described herein, the first vacuum region 110 and the second vacuum region 120 can be separated by a separation device 150. As an example, the separation device 150 can be a wall or wall portion of a vacuum chamber, such as the above-mentioned first vacuum chamber and/or second vacuum chamber. In another example, the separation device 150 can be provided within the one vacuum chamber that accommodates the first vacuum region 110 and the second vacuum region 120. In some implementations, the separation device 150 can have an opening 152 configured to let pass at least a portion of the primary charged particle beam. In other words, the primary charged particle beam can exit the first vacuum region 110 and enter the second vacuum region 120 through the opening 152. The opening 152 can also be referred to as "exit opening". The opening 152 can be at least one of covered, closed off and sealed by the membrane 140 to mechanically separate the first vacuum region 110 from the second vacuum region 120.

In some implementations, the first vacuum generation device 160 can be connectable to the first vacuum region 110, e.g., the first vacuum chamber, via a first flange 161. The second vacuum generation device 162 can be connectable to the second vacuum region 120, e.g., the second vacuum chamber, via a second flange 163. The first vacuum region 110 and the second vacuum region 120 can be adjacent vacuum regions. According to some embodiments, which can be combined with other embodiments described herein, at least one of the first vacuum generation device 160 and the second vacuum generation device 162 can be selected from the group consisting of a turbo molecular pump, an ion getter pump, such as a non-evaporable getter pump, a cryopump, and any combination thereof.

Figure 2:
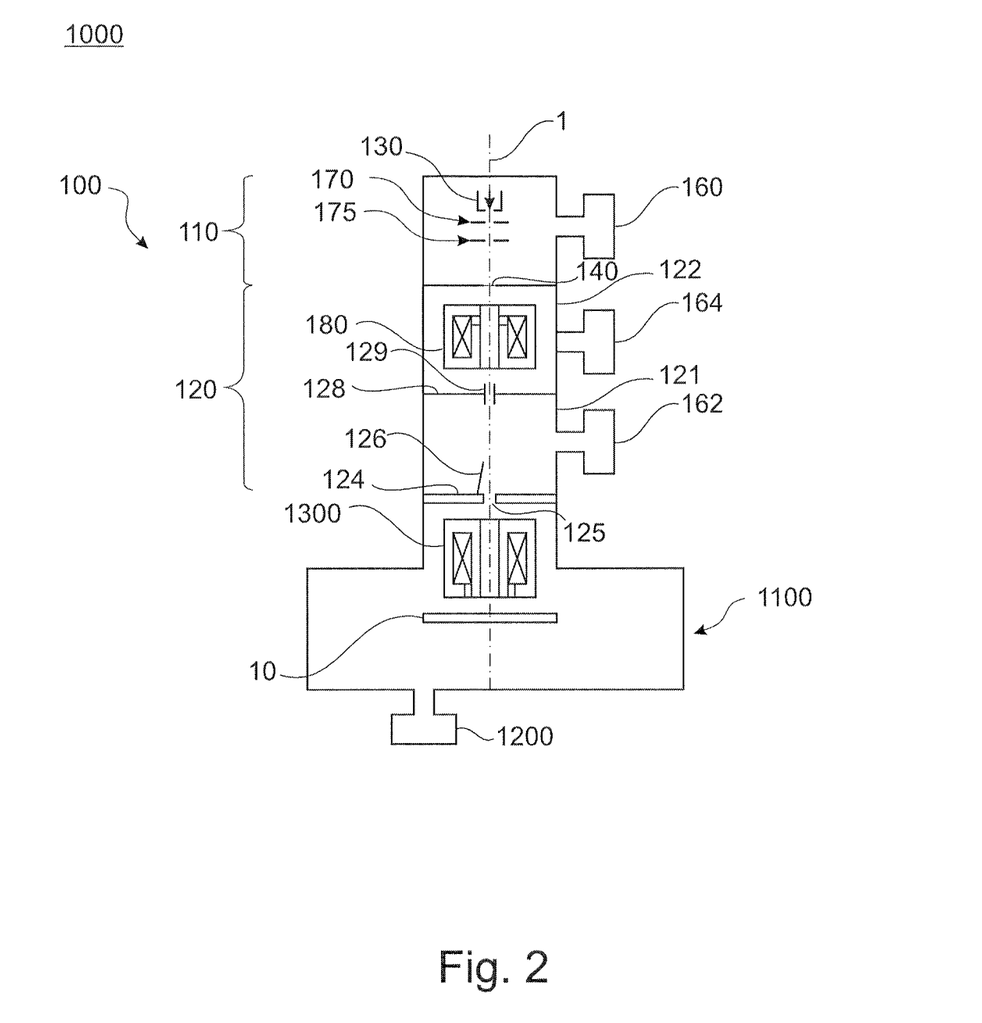
FIG. 2 shows a schematic view of a charged particle beam device having a charged particle source arrangement according to embodiments described herein.

FIG. 2 shows a schematic view of a charged particle beam device 1000 having a charged particle source arrangement 100 according to embodiments described herein. The charged particle beam device 1000 can for example be an electron microscope, such as a scanning electron microscope (SEM) or a scanning transmission electron microscope (STEM), or a focused ion beam system (FIB). An electron microscope can for example be an electron microscope for critical dimensioning (CD), defect review (DR), or inspection (EBI, that is electron beam inspection).

Without limiting the scope of protection of the present application, in the following the charged particle beam device or components thereof will exemplarily be referred to as a charged particle beam device including the charged particle source adapted for generation of electrons. However, other types of charged particles, e.g. positive ions, could be used.

In a charged particle beam device, the performance of a charged particle source (e.g., a gun performance) should be considered with respect to a total performance of the charged particle beam devices. As an example, in scanning electron beam columns for CD, DR and EBI applications, high brightness electron sources and/or high emission current sources with high emission stability can be used. Such charged particle sources can include, for example, field emission electron sources or carbon nanotubes. A high vacuum (low pressure) should be provided for such charged particle sources, e.g., in a range of $10^{-7}$ to $10^{-9}$ Pa, or even below $10^{-10}$ Pa. Also a low partial pressure of at least some residual gases, which may poison the charged particle emitter (e.g., an electron emitter) is beneficial. For example, oxygen can have a negative impact on the work function of an emitter material and on the charged particle emission.

In vacuum systems, some effort has to be made to approach specific vacuum conditions in a gun area. Even with such efforts, there can be a back-streaming of molecules from the vacuum regions with higher pressure towards the charged particle source, e.g., through differential pumping apertures. In some implementations, the last differential aperture can be positioned close to the anode or can be an anode aperture which is directly located in front of, for example, an electron emitting cathode. Even with large pumping power a direct bombardment of the charged particle source with molecules penetrating the anode aperture cannot be avoided. Such molecules and their adsorption on the surface of the charged particle source, e.g., a cathode surface, may have a negative impact on the performance, in particular on noise, mid-term and long-term emission stability. Such instabilities may be reduced by occasional short heating cycles of the cathode (flashing), and can be performed e.g. in CFE electron gun systems.

The present disclosure provides a thin membrane close to the charged particle source, e.g., in the anode or the extractor to mechanically separate the first vacuum region with the charged particle source from intermediate regions or areas, such as the second vacuum region. In particular, the first vacuum region ("gun vacuum") can be vacuum-wise sealed off from the remaining vacuum system of the charged particle source arrangement or charged particle beam device, e.g., an electron optical system. A back streaming of molecules towards the charged particle source can be reduced or even avoided. This may allow a reduction of a number of intermediate pumping stages and/or their pumping power. In some implementations, the vacuum pumping system of the charged particle source arrangement can be reduced (e.g., less or smaller pumps). Openings in the differential pumping apertures can be enlarged, reducing or even avoiding a risk of contamination and/or charging caused by the passing primary charged particle beam. Based on the above, no or less source contamination will occur, which may result in an improved source performance and/or a provision of high brightness and stable emission (low noise, high long-term stability).

For achieving suitable vacuum conditions in the first vacuum region 110, which can for example also be referred to as "electron gun area", the present disclosure provides a differential pumping approach and a membrane acting as a gas barrier. As an example, different vacuum regions or vacuum areas, such as the first vacuum region 110 and the second vacuum region 120, can be provided in an optical column of the charged particle beam device 1000. Each of those vacuum regions can be separately pumped, e.g., using pumping systems which can be adapted to pump the gas load generated in the specific vacuum areas, such as the first vacuum region 110 and the second vacuum region 120.

The charged particle beam device 1000 can include the charged particle source arrangement 100 according to the embodiments described herein, and a sample chamber 1100 connected to the charged particle source arrangement 100. A sample 10 or specimen can be provided in the sample chamber 1100. The sample 10 can be provided on a sample support (not shown). The sample support can be a movable stage for positioning the sample 10. For example, the movable stage can be configured for moving the sample 10 in one direction (e.g. X direction) or in two directions (e.g. X-Y-directions).

A sample or specimen as referred to herein, includes, but is not limited to, semiconductor wafers, semiconductor workpieces, and other workpieces such as memory disks and the like. Embodiments of the disclosure may be applied to any workpiece on which material is deposited or which are structured. A sample or specimen can include a surface to be structured or on which layers are deposited, an edge, e.g., a bevel.

The charged particle source 130 generates the primary charged particle beam. According to some embodiments, which can be combined with other embodiments described herein, the charged particle source 130 includes an emitter having a tip, such as a sharp tip. According to some implementations, a high brightness, low energy width source can be provided. For example, a field emitter or carbon nanotubes can be provided as the charged particle source 130. The field emitters can include, but are not limited to, field emission electron sources such as thermal field emission sources, Schottky emission sources, and cold field emission sources.

The primary charged particle beam is guided in the charged particle beam device 1000 along the optical axis 1 and is focused on the sample 10 by an objective lens 1300 provided in the sample chamber 1100. According to some embodiments, the objective lens 1300 images, for example, the emitter tip of the charged particle source 130 on the sample 10. In some implementations, the objective lens 1300 can be provided by a magnetic lens portion and an electrostatic lens portion. According to some embodiments, which can be combined with other embodiments described herein, a deceleration of the primary charged particle beam can be provided, for example, in the vicinity of the sample 10, in or behind the objective lens 1300, or a combination thereof. For example, according to some embodiments, a retarding bias voltage can be applied to the sample 10. The objective lens 1300 can be an electrostatic-magnetic compound lens having e.g. an axial gap or a radial gap, or the objective lens 1300 can be an electrostatic retarding field lens.

According to some embodiments, which can be combined with other embodiments described herein, the second vacuum region 120 includes a first vacuum sub-region 121 and a second vacuum sub-region 122. The first vacuum sub-region 121 and the second vacuum sub-region 122 can be separated by a separation means 128. The separation means 128 can be positioned in a transition area between the first vacuum sub-region 121 and the second vacuum sub-region 122. The separation means 128 can include an opening 129 or aperture configured to let the primary charged particle beam pass through. In some implementations, the separation means 128 can include one or more pressure limiting devices or modules (e.g., tubes, and the like) provided at the opening 129 to reduce back streaming from the worse to the better vacuum region, e.g., from the second vacuum sub-region 122 to the first vacuum sub-region 121.

According to some implementations, a condenser lens 180 can be provided, e.g., in the second vacuum sub-region 122 of the second vacuum region 120. The condenser lens 180 can be magnetic and have pole pieces and one or more coils. Alternatively, the condenser lens 180 can be electrostatic or combined magnetic-electrostatic.

According to some embodiments, which can be combined with other embodiments described herein, the second vacuum generation device 162 is connectable to the first vacuum sub-region 121 and a third vacuum generation device 164 is connectable to the second vacuum sub-region 122. The third vacuum generation device 164 can be selected from the group consisting of a turbo molecular pump, an ion getter pump, such as a non-evaporable getter pump, a cryopump, and any combination thereof.

In some implementation, a sample chamber vacuum generation device 1200 can be connected to the sample chamber 1100. The sample chamber 1100 can be adapted to provide a sample vacuum region, e.g., by using the sample chamber vacuum generation device 1200. The sample chamber vacuum generation device 1200 can be selected from the group consisting of a turbo molecular pump, an ion getter pump, such as a non-evaporable getter pump, a cryopump, and any combination thereof. In some implementations, a turbo molecular pump can be used for the sample chamber 1110. At least one of turbo molecular pumps, ion getter pumps and NEG pumps can be used in intermediate vacuum regions, such as the second vacuum region 120. Ion getter pumps and/or NEG pumps can be used in the first vacuum region 110. In some implementations, cryopumps may be used that provide a large pumping speed.

As an example, starting from a sample chamber 1100 having a vacuum e.g. in a range of $10^{-2}$ to $10^{-4}$ Pa (it is noted that the vacuum can be significantly worse (higher pressure) in an environmental SEM), at least one intermediate vacuum area, such as the second vacuum region 120 or the first vacuum sub-region 121, can be provided between the sample vacuum region and the first vacuum region 110. In some implementations, the second vacuum region 120, and in particular the first vacuum sub-region 121 can provide a vacuum in a range of $10^{-4}$ to $10^{-7}$ Pa. The first vacuum region 110 can provide a vacuum in a range of $10^{-7}$ to $10^{-9}$ Pa. As an example, if a vacuum of $10^{-9}$ Pa or below is required in the first vacuum region 110, the second vacuum sub-region 122 may be provided with a vacuum in the range of $10^{-7}$ to $10^{-9}$. Each of those vacuum regions can be pumped separately. Transition areas between at least some of those vacuum regions can be provided with pressure limiting modules (e.g., apertures, tubes, and the like) to reduce back streaming from the vacuum region with higher pressure to the vacuum regions with lower pressure.

According to some embodiments, which can be combined with other embodiments described herein, the sample chamber 1100 can be separated from the second vacuum region 120 using a valve device 124. The valve device 124 can have a separation wall separating the sample vacuum region from the second vacuum region 120, e.g., the first vacuum sub-region 121. The separation wall can have an opening 125 configured to let the primary charged particle beam pass through and a lid 126 configured to close or seal the opening 125. The opening 125 and a lid 126 can be configured as a valve. However, the present disclosure is not limited thereto and the valve can be any valve that is configured to let the primary charged particle beam pass through when the valve is in an open state.

In some embodiments, at least one of an extractor 170 and an anode 175 can be provided in the first vacuum region 110. The extractor 170, and optionally the anode 175 can be configured to accelerate the primary charged particle beam. As an example, the anode 175 can be configured to accelerate the primary charged particle beam so that the primary charged particle beam has a predetermined energy when the primary charged particle beam passes the membrane 140. In some implementations, the energy of the primary charged particle beam passing through the membrane 140 can be in a range of 5 or above, specifically in a range of 10 to 50 keV, and more specifically about 15 or 40 keV. As an example, the energy of the primary charged particle beam passing through the membrane 140 can be in a range of 5 to 40 keV. In transmission electron microscopes (TEM) and scanning transmission microscopes (STEM) the beam energy can even exceed 100 keV.

According to some embodiments, which can be combined with other embodiments described herein, the membrane 140 can be provided in or at the extractor 170 or anode 175. As an example, the extractor 170 or anode 175 can have an aperture opening in which the membrane 140 is situated.

It is to be understood that one or more other optical components like alignment systems, correction systems, detectors etc. that are not shown in the present figures can be provided. In some implementations, e.g. in the case that charged particle scattering inside the membrane 140 generates negative impacts on an electron probe performance, dispersion generating means in the optical path can be provided to sort out at least some of the disturbing charged particles because such disturbing charged particles have suffered from an energy loss. Dispersion generating means may be provided by at least one of the deflectors, e.g., the magnetic deflector in the B, 2B or 4B configurations and monochromators or energy filters.

Figures 3, 4:
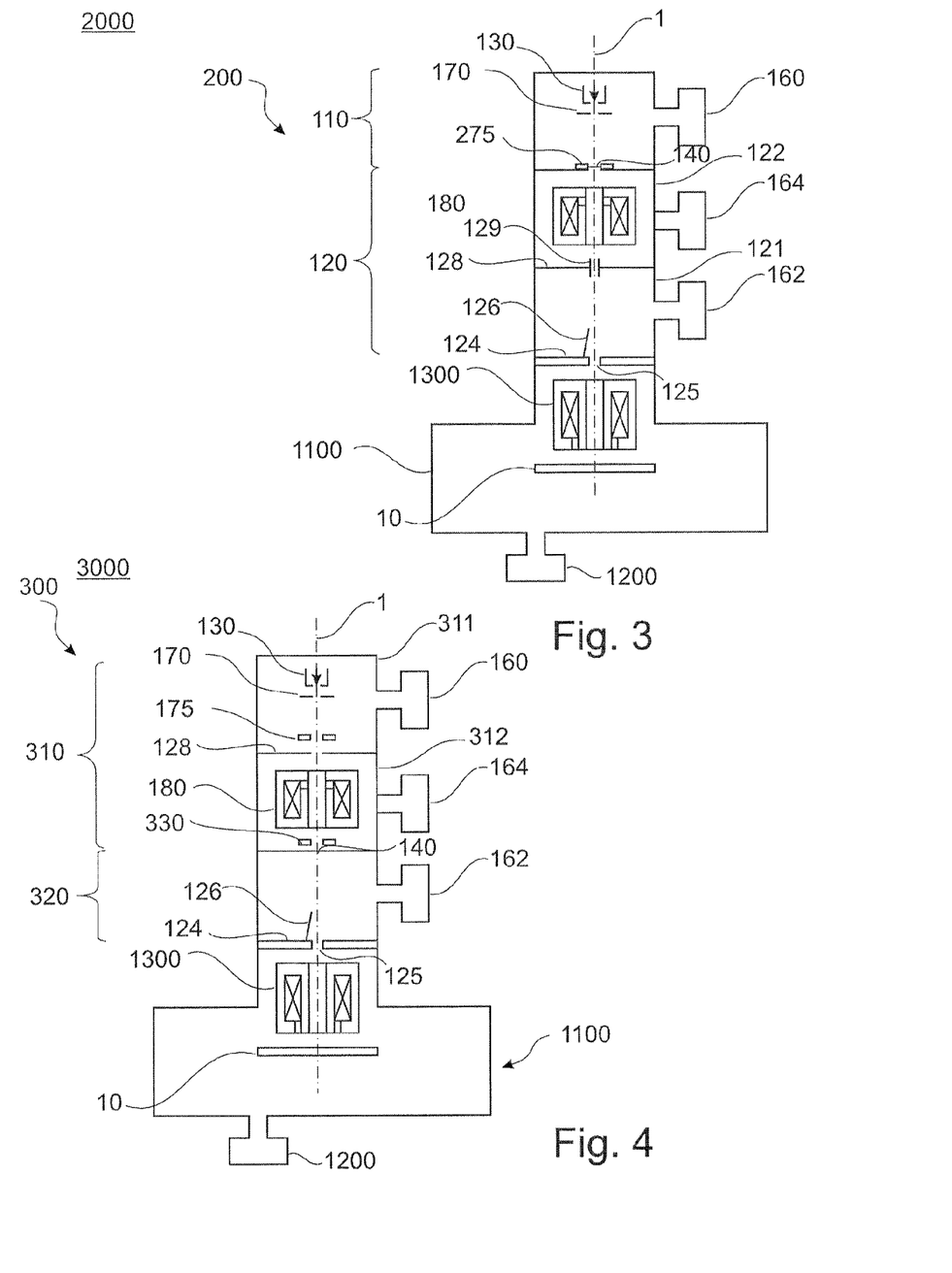
FIG. 3 shows a schematic view of a charged particle beam device having a charged particle source arrangement according to further embodiments described herein.
FIG. 4 shows a schematic view of a charged particle beam device having a charged particle source arrangement according to still further embodiments described herein.

FIG. 3 shows a schematic view of a charged particle beam device 2000 having a charged particle source arrangement 200 according to further embodiments described herein. The charged particle beam device 2000 of FIG. 3 is similar to the device of FIG. 2, and the description given above with reference to FIG. 2 applies to the embodiment of FIG. 3. A difference between the embodiments lies in the configuration of the membrane 140 and the anode 275. As shown in the example of FIG. 3, the membrane 140 and the anode 275 can be integrated. In other examples, the membrane 140 and the extractor 170 can be integrated.

According to some embodiments, which can be combined with other embodiments described herein, the membrane 140 has a transparent portion configured to let at least a portion of the primary charged particle beam pass through, and a blocking portion at least partially surrounding the transparent portion. The blocking portion can be configured to block charged particles. As an example, the membrane 140 can have the transparent portion (e.g., 10 to 300 micrometers in diameter) and a thicker surrounding portion, i.e., the blocking portion, which blocks at least a portion of the primary charged particle beam. In other words, the membrane 140 may act as beam limiting aperture. In some implementations, the blocking portion is configured as the anode 275. In other words, the anode 275 forms the blocking portion.

In some embodiments, the primary charged particle beam can have a high beam energy when penetrating the membrane 140. As an example, the primary charged particles, such as electrons, can be accelerated between the charged particle source 130 and the anode 275 to high energies, e.g. of 10 key or preferably higher, e.g. to 30 keV or higher. In the case that lower landing energies are beneficial, the energy of the primary charged particles can be reduced later, e.g. by a deceleration in the objective lens 1300 and/or between the objective lens 1300 and the sample 10. As an example, objective lens aberrations and electron-electron interaction inside the charged particle beam device (e.g., the column thereof) can be reduced using such a configuration.

According to some embodiments, which can be combined with other embodiments described herein, a first power supply (not shown) can be connected to the anode 275. The first power supply can be configured to bias the anode 275 to a first potential. According to some embodiments, which can be combined with other embodiments described herein, a second power supply (not shown) can be connected to the extractor 170. The second power supply can be configured to bias the extractor 170 to a second potential. A voltage difference between the anode 275 and the extractor 170 can be larger than 100 kV. As an example, the voltage difference can be in a range of 0 to 40 kV, specifically in a range of 0 to 10 kV, and more specifically in a range of 5 to 30 kV. In some SEM applications the voltage difference can be in a range of 5 to 30 kV. In TEM the voltage can be larger than 100 kV.

FIG. 4 shows a schematic view of a charged particle beam device 3000 having a charged particle source arrangement 300 according to embodiments described herein. The charged particle beam device 3000 of FIG. 4 is similar to the devices of FIGS. 2 and 3, and the description given above with reference to FIGS. 2 and 3 applies to the embodiment of FIG. 4. A difference between both embodiments lies in the configuration of the first vacuum region 310 and the second vacuum region 320 and the provision of a beam limiting aperture 330.

According to some embodiments, which can be combined with other embodiments described herein, the first vacuum region 310 includes a first vacuum sub-region 311 and a second vacuum sub-region 312. The first vacuum sub-region 311 and the second vacuum sub-region 312 can be separated by, e.g., a separation means 128. The separation means 128 can be configured as described with reference to FIG. 2. In particular, the separation means 128 can be positioned in a transition area between the first vacuum sub-region 311 and the second vacuum sub-region 312. According to some implementations, the condenser lens 180 can be provided in the second vacuum sub-region 312 of the first vacuum region 310.

According to some embodiments, which can be combined with other embodiments described herein, the first vacuum generation device 160 is connectable to the first vacuum sub-region 311 and the third vacuum generation device 164 is connectable to the second vacuum sub-region 312. The third vacuum generation device 164 can be selected from the group consisting of a turbo molecular pump, an ion getter pump, such as a non-evaporable getter pump, a cryopump, and any combination thereof.

According to some embodiments, which can be combined with other embodiments described herein, the charged particle beam device 3000, and in particular the charged particle source arrangement 300, can include one or more beam limiting apertures 330. The one or more beam limiting apertures 330 can be located in an area of the membrane 140. As an example, the one or more beam limiting apertures 330 can be located in the second vacuum sub-region 312, e.g., below the condenser lens 180. The one or more beam limiting apertures 330, which can be located in the intermediate vacuum, can become part of the protected vacuum area, resulting in reduced contamination sensitivity and therefore increased optical stability.

Figure 5A:
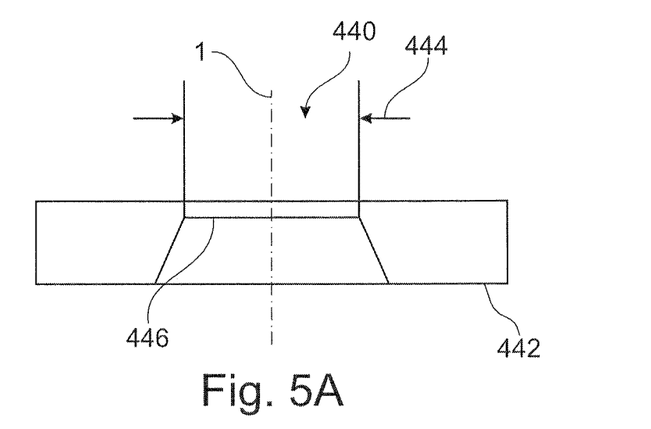
FIGS. 5A-B show schematic views of a membrane of a charged particle source arrangement according to embodiments described herein.
Figure 5B:
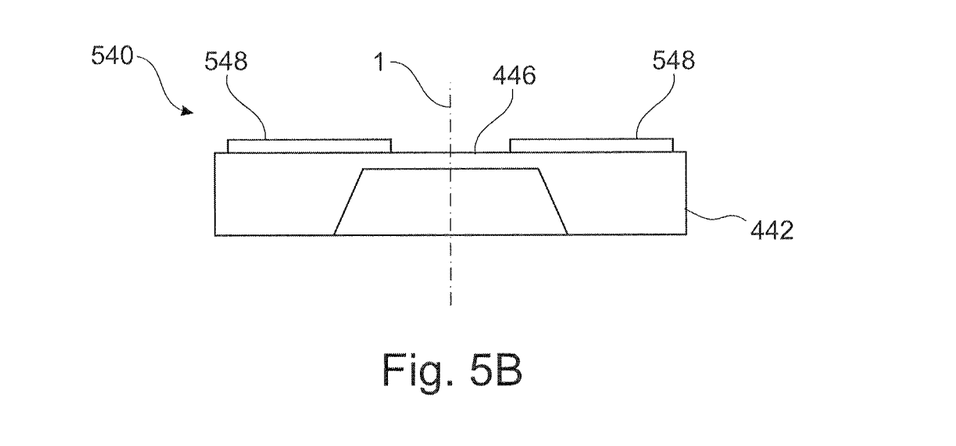

FIGS. 5A-B show schematic views of membranes of a charged particle source arrangement according to embodiments described herein.

Referring to FIG. 5A, according to some embodiments, which can be combined with other embodiments described herein, the membrane 440 has a transparent portion 446 (or transparent area) configured to let at least the portion of the primary charged particle beam pass through. The transparent portion 446 can have a substantially circular shape. According to some implementations, the charged particle source arrangement includes a membrane body 442. As an example, the membrane 440 and the membrane body 442 are formed from one piece, i.e., the membrane 440 and the membrane body 442 can be integrally formed. In such a case, the membrane 440 and the membrane body 442 can be made from the same material. In some embodiments, the transparent portion 446 can formed in the membrane body 442. As an example, the transparent portion 446 can be created by forming a recess in the membrane body 442.

In another example, the membrane 440 and the membrane body 442 can be connected to each other. In other words, the membrane 440 and the membrane body 442 can be formed as separate entities. In such a case, the membrane 440 and the membrane body 442 can be made from the same material or form different materials. As an example, the membrane 440 can be attached to the membrane body 442, e.g., using at least one of screws, clamping and an adhesive.

According to some embodiments, which can be combined with other embodiments described herein, the membrane 440, and in particular the transparent portion 446, has a diameter 444 in a range of 1 micrometer to 10 mm, specifically in a range of 1 micrometer to 1 mm, and more specifically in a range of 10 micrometers to 500 micrometers. As an example, the diameter 444 of the transparent portion 446 can be adapted to the beam width of the primary charged particle beam.

According to some embodiments, which can be combined with other embodiments described herein, the membrane 440, and in particular the transparent portion 446, has a thickness in a range of 1 nm to 1000 nm, specifically in a range of 5 to 500 nm, and more specifically in a range of 20 to 100 nm. The thickness of the membrane 440, and in particular of the transparent portion 446, can be selected such that the primary charged particles can pass through the membrane 440 or the transparent portion 446 substantially undisturbed. In other words, intensity loss caused by the membrane 440 or the transparent portion 446 is minimized or even avoided. As an example, the membrane 440 can be a thin material and/or light material to enable nearly undisturbed electron transition. According to some embodiments, which can be combined with other embodiments described herein, the thickness of the membrane is homogenous or constant.

According to some embodiments, which can be combined with other embodiments described herein, the membrane 440, and in particular the transparent portion 446, is made of a solid material. The term "solid material" can be taken to mean a material that is suitable to provide the gas barrier between the first vacuum region and the second vacuum region to mechanically separate the first vacuum region from the second vacuum region. As an example, the solid material includes a material selected from the group consisting of: Silicon, carbon, silicon oxide, silicon nitride, and any combination thereof.

Referring to FIG. 5B, according to some embodiments, which can be combined with other embodiments described herein, the membrane 540 has a blocking portion 548 at least partially surrounding the transparent portion 446. The blocking portion 548 can be configured to block charged particles. As an example, the blocking portion 548 is configured as the anode 275 or the extractor 170 of FIG. 3. In such a configuration, the membrane 540 can be configured as a beam limiting aperture. In some implementations, the blocking portion 548 can be formed by masking the membrane 540 or membrane body 442, e.g., with a non-transparent material.

Figure 6:
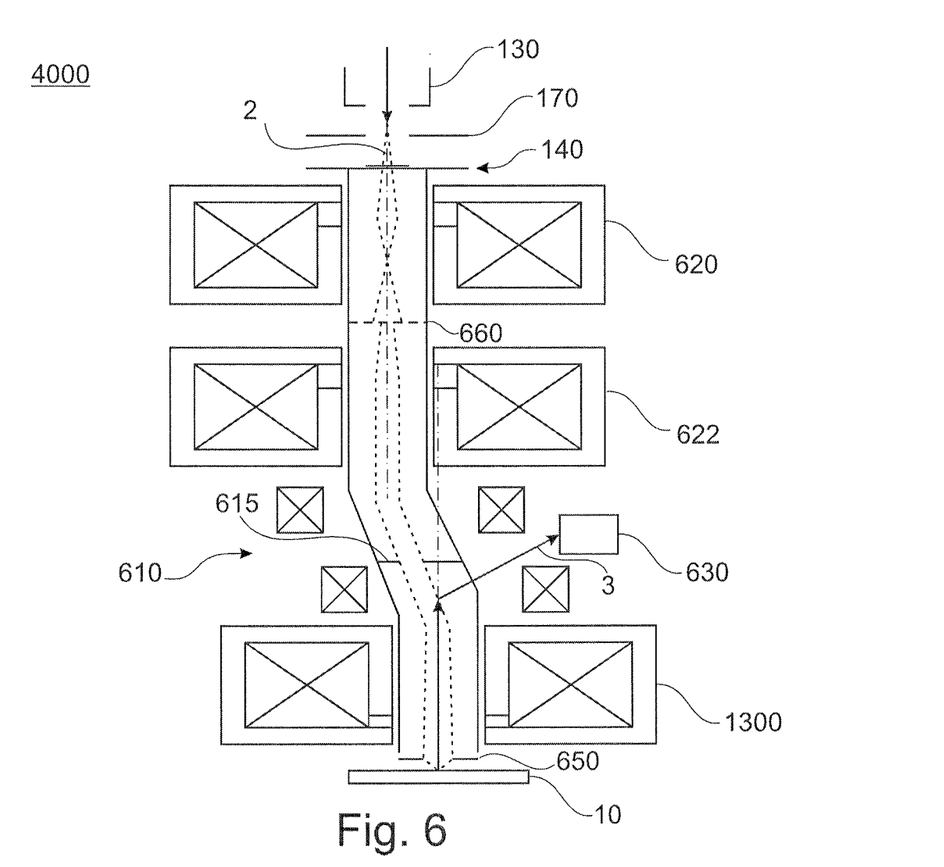
FIG. 6 shows a schematic view of a charged particle beam device having a charged particle source arrangement according to embodiments described herein.

FIG. 6 shows a schematic view of a charged particle beam device 4000 having a charged particle source arrangement and a signal charged particle detection system according to embodiments described herein.

The charged particle beam device 4000 includes the charged particle source 130 producing the primary charged particle beam 2 which is directed towards the sample 10 through the objective lens 1300. Signal charged particles, such as secondary electrons (SE), released from or backscattered from the sample 10 form the signal charged particle beam 3 carrying information about the sample 10. The information can include information about the topography of the sample 10, chemical constituents, electrostatic potential, and others.

According to some implementations, a first condenser 620 and a second condenser 622 can be provided, e.g., between a charged particle deflection device 610 and the membrane 140. The first condenser 620 and/or the second condenser 622 can be magnetic and can have pole pieces and one or more coils. Alternatively, the first condenser 620 and/or the second condenser 622 can be electrostatic or combined magnetic-electrostatic. The first condenser 620 and/or the second condenser 622 can also be referred to as "condenser lenses". In some embodiments, an aperture, such as a multi-aperture 660 can be provided, e.g., between the first condenser 620 and the second condenser 622.

In some implementations, an electrode 650 can be provided for an extraction field control. The electrode 650 can be biased to extract the signal charged particles from a sample region. As an example, the electrode 650 can be positively biased to extract secondary electrons from the sample region, e.g., from a sample surface.

The signal charged particle beam 3 is separated from the primary charged particle beam 2 by means of the charged particle deflection device 610. The charged particle deflection device 610 can include at least one of a beam splitter and a beam bender, one or more apertures, such as a spray aperture or knife edge aperture 615, or any combination thereof. The signal charged particle beam 3 is guided towards a detector assembly 630, which can include a sensor, such as a scintillator, pin diode etc.

In some implementations, e.g. in the case that charged particle scattering inside the membrane 140 generates negative impacts on an electron probe performance, dispersion generating means in the optical path can be provided to sort out at least some of the disturbing charged particles because such disturbing charged particles have suffered from an energy loss. Dispersion generating means may be provided by the charged particle deflection device 610, and in particular by at least one of deflectors, e.g., magnetic deflector in B, 2B or 4B configurations and monochromators.

Figure 7:
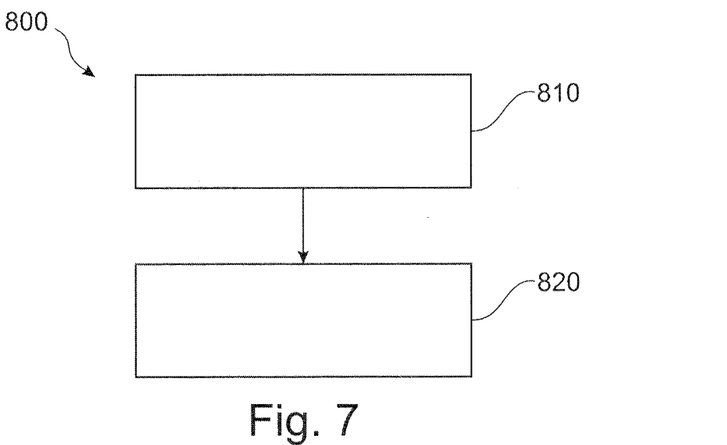
FIG. 7 shows a flow chart of a method for providing a primary charged particle beam for sample inspection in a charged particle beam device according to embodiments described herein.

FIG. 7 shows a flow chart of a method 800 for providing a primary charged particle beam for sample inspection in a charged particle beam device according to embodiments described herein.

The method 800 includes: Emitting the primary charged particle beam in block 810 using a charged particle source in a first vacuum region; and guiding at least a portion of the primary charged particle beam from the first vacuum region into a second vacuum region through a membrane in block 820. The membrane is configured to provide a gas barrier between the first vacuum region and the second vacuum region. In particular, the membrane can be configured according to the embodiments described herein.

The present disclosure enables the generation of good vacuum levels using a simple configuration. In particular, a differential pumping of the first vacuum region and the second vacuum region, which are separated by the membrane, can be performed. Improved vacuum conditions can be achieved in the first vacuum region, in which the charged particle source is provided. By mechanically separating the first vacuum region from the second vacuum region using the membrane, a contamination of the charged particle source, e.g., with molecules drifting from the second vacuum region into the first vacuum region can be reduced or even avoided. A stability of the charged particle source can be increased.

According to embodiments described herein, the method for providing a primary charged particle beam for sample inspection in a charged particle beam device can be conducted by means of computer programs, software, computer software products and the interrelated controllers, which can have a CPU, a memory, a user interface, and input and output means being in communication with the corresponding components of the apparatus for processing a large area substrate.

While the foregoing is directed to embodiments of the disclosure, other and further embodiments of the disclosure may be devised without departing from the basic scope thereof, and the scope thereof is determined by the claims that follow.

The invention claimed is:

1. A charged particle source arrangement for a charged particle beam device, comprising:
   a first vacuum region and a second vacuum region;
   a charged particle source in the first vacuum region, wherein the charged particle source is configured to generate a primary charged particle beam; and
   a membrane configured to provide a gas barrier between the first vacuum region and the second vacuum region, and wherein the membrane is configured to let at least a portion of the primary charged particle beam pass through the membrane,
   wherein a first vacuum generation device is connectable to the first vacuum region and a second vacuum generation device is connectable to the second vacuum region.

2. The charged particle source arrangement of claim 1, wherein the membrane is made of a solid material.

3. The charged particle source arrangement of claim 2, wherein the solid material includes a material selected from the group consisting of: Silicon, carbon, silicon oxide, silicon nitride, and any combination thereof.

4. The charged particle source arrangement of claim 1, wherein the membrane has a thickness in a range of 1 nm to 1000 nm.

5. The charged particle source arrangement of claim 1, wherein the membrane has a transparent portion configured to let at least the portion of the primary charged particle beam pass through the membrane, and a blocking portion at least partially surrounding the transparent portion, wherein the blocking portion is configured to block charged particles.

6. The charged particle source arrangement of claim 5, wherein the blocking portion is configured as an anode or an extractor.

7. The charged particle source arrangement of claim 1, wherein the membrane is at least partially covered with a conductive material.

8. The charged particle source arrangement of claim 1, wherein at least a part of the membrane is doped to provide electrical conductivity.

9. The charged particle source arrangement of claim 1, wherein the first vacuum region includes a first vacuum sub-region and a second vacuum sub-region separated by a separation means, and wherein the separation means includes an opening configured to let the primary charged particle beam pass through.

10. The charged particle source arrangement of claim 9, wherein the first vacuum generation device is connectable to the first vacuum sub-region and a third vacuum generation device is connectable to the second vacuum sub-region.

11. The charged particle source arrangement of claim 9, wherein the charged particle source is provided in the first vacuum sub-region.

12. The charged particle source arrangement of claim 1, wherein the second vacuum region includes a first vacuum sub-region and a second vacuum sub-region, wherein the first vacuum sub-region and the second vacuum sub-region are separated by a separation means, and wherein the separation means includes an opening configured to let the primary charged particle beam pass through.

13. The charged particle source arrangement of claim 12, wherein the second vacuum generation device is connectable to the first vacuum sub-region and a third vacuum generation device is connectable to the second vacuum sub-region.

14. The charged particle source arrangement of claim 9, wherein a condenser lens is provided in the second vacuum sub-region.

15. The charged particle source arrangement of claim 1, including a first vacuum chamber, wherein the first vacuum chamber is configured to provide the first vacuum region, and including a second vacuum chamber, wherein the second vacuum chamber is configured to provide the second vacuum region, and wherein the membrane is configured to seal the first vacuum chamber and the second vacuum chamber from one another.

16. The charged particle source arrangement of claim 1, wherein an energy of the primary charged particle beam passing through the membrane is in a range of 5 to 40 keV.

17. A charged particle beam device for sample inspection, comprising:
   the charged particle source arrangement of claim 1; and
   a sample chamber connected to the charged particle source arrangement.

18. A method for providing a primary charged particle beam for sample inspection in a charged particle beam device, the method comprising:
   emitting the primary charged particle beam using a charged particle source in a first vacuum region; and guiding at least a portion of the primary charged particle beam from the first vacuum region into a second vacuum region through a membrane, wherein the membrane is configured to provide a gas barrier between the first vacuum region and the second vacuum region.

* * * * *